(12) United States Patent
Papaefthymiou et al.

(10) Patent No.: US 8,362,811 B2
(45) Date of Patent: Jan. 29, 2013

(54) ARCHITECTURE FOR SINGLE-STEPPING IN RESONANT CLOCK DISTRIBUTION NETWORKS

(75) Inventors: Marios C. Papaefthymiou, Ann Arbor, MI (US); Alexander Ishii, Princeton, NJ (US)

(73) Assignee: Cyclos Semiconductor, Inc., Berkeley, CA (US)

( * ) Notice: Subject to any disclaimer, the term of this patent is extended or adjusted under 35 U.S.C. 154(b) by 0 days.

(21) Appl. No.: 12/903,172

(22) Filed: Oct. 12, 2010

(65) Prior Publication Data

US 2011/0084773 A1 Apr. 14, 2011

Related U.S. Application Data

(60) Provisional application No. 61/250,830, filed on Oct. 12, 2009.

(51) Int. Cl.
*H03B 1/00* (2006.01)
(52) U.S. Cl. .......................... 327/108; 327/110
(58) Field of Classification Search .......... 327/108–112; 326/82–88
See application file for complete search history.

(56) References Cited

U.S. PATENT DOCUMENTS

| | | |
|---|---|---|
| 4,611,135 A | 9/1986 | Nakayama et al. |
| 5,023,480 A | 6/1991 | Gieseke et al. |
| 5,036,217 A | 7/1991 | Rollins et al. |
| 5,111,072 A | 5/1992 | Seidel |
| 5,122,679 A | 6/1992 | Ishii et al. |
| 5,146,109 A | 9/1992 | Martignoni et al. |
| 5,311,071 A | 5/1994 | Ueda |
| 5,332,916 A | 7/1994 | Hirai |
| 5,384,493 A | 1/1995 | Furuki |
| 5,396,527 A | 3/1995 | Schlecht et al. |
| 5,410,491 A | 4/1995 | Minami |
| 5,430,408 A | 7/1995 | Ovens et al. |
| 5,473,526 A | 12/1995 | Svensson et al. |
| 5,489,866 A | 2/1996 | Diba |
| 5,504,441 A | 4/1996 | Sigal |
| 5,506,520 A | 4/1996 | Frank et al. |
| 5,506,528 A | 4/1996 | Cao et al. |
| 5,508,639 A | 4/1996 | Fattaruso |
| 5,517,145 A | 5/1996 | Frank |
| 5,517,399 A | 5/1996 | Yamauchi et al. |
| 5,526,319 A | 6/1996 | Dennard et al. |

(Continued)

FOREIGN PATENT DOCUMENTS

| | | |
|---|---|---|
| EP | 0953892 | 11/1999 |
| EP | 1126612 | 8/2001 |

(Continued)

OTHER PUBLICATIONS

International Search Report and Written Opinion issued in PCT/US2010/052405 on Jun. 23, 2011.

(Continued)

*Primary Examiner* — An Luu
(74) *Attorney, Agent, or Firm* — Sheppard, Mullin, Richter & Hampton LLP

(57) ABSTRACT

A resonant clock distribution network architecture is proposed that is capable of single-step operation through the use of selective control in the resonant clock drivers and the deployment of flip-flops that require the clock to remain stable for a sufficiently long time between any two consecutive state updates. Such a network is generally applicable to semiconductor devices with various clock frequencies, and high-performance and low-power clocking requirements such as microprocessors, ASICs, and SOCs.

15 Claims, 9 Drawing Sheets

U.S. PATENT DOCUMENTS

| | | | |
|---|---|---|---|
| 5,537,067 A | 7/1996 | Carvajal et al. | |
| 5,559,463 A | 9/1996 | Denker et al. | |
| 5,559,478 A | 9/1996 | Athas et al. | |
| 5,587,676 A | 12/1996 | Chowdhury | |
| 5,675,263 A | 10/1997 | Gabara | |
| 5,701,093 A | 12/1997 | Suzuki | |
| 5,734,285 A | 3/1998 | Harvey | |
| 5,760,620 A | 6/1998 | Doluca | |
| 5,838,203 A | 11/1998 | Stamoulis et al. | |
| 5,841,299 A | 11/1998 | De | |
| 5,872,489 A | 2/1999 | Chang et al. | |
| 5,892,387 A | 4/1999 | Shigehara et al. | |
| 5,896,054 A | 4/1999 | Gonzalez | |
| 5,970,074 A | 10/1999 | Ehiro | |
| 5,986,476 A | 11/1999 | De | |
| 5,999,025 A | 12/1999 | New | |
| 6,009,021 A | 12/1999 | Kioi | |
| 6,009,531 A | 12/1999 | Selvidge et al. | |
| 6,011,441 A | 1/2000 | Ghoshal | |
| 6,037,816 A | 3/2000 | Yamauchi | |
| 6,052,019 A | 4/2000 | Kwong | |
| 6,069,495 A | 5/2000 | Ciccone et al. | |
| 6,091,629 A | 7/2000 | Osada et al. | |
| 6,150,865 A | 11/2000 | Fluxman et al. | |
| 6,160,422 A | 12/2000 | Huang | |
| 6,169,443 B1 | 1/2001 | Shigehara et al. | |
| 6,177,819 B1 | 1/2001 | Nguyen | |
| 6,230,300 B1 | 5/2001 | Takano | |
| 6,242,951 B1 | 6/2001 | Nakata et al. | |
| 6,278,308 B1 | 8/2001 | Partovi et al. | |
| 6,323,701 B1 | 11/2001 | Gradinariu et al. | |
| RE37,552 E | 2/2002 | Svensson et al. | |
| 6,433,586 B2 | 8/2002 | Ooishi | |
| 6,438,422 B1 | 8/2002 | Schu et al. | |
| 6,477,658 B1 | 11/2002 | Pang | |
| 6,538,346 B2 | 3/2003 | Pidutti et al. | |
| 6,542,002 B2 | 4/2003 | Jang et al. | |
| 6,559,681 B1 | 5/2003 | Wu et al. | |
| 6,563,362 B2 | 5/2003 | Lambert | |
| 6,608,512 B2 | 8/2003 | Ta et al. | |
| 6,720,815 B2 | 4/2004 | Mizuno | |
| 6,742,132 B2 | 5/2004 | Ziesler et al. | |
| 6,777,992 B2 | 8/2004 | Ziesler et al. | |
| 6,856,171 B1 | 2/2005 | Zhang | |
| 6,879,190 B2 | 4/2005 | Kim et al. | |
| 6,882,182 B1 | 4/2005 | Conn et al. | |
| 7,005,893 B1 | 2/2006 | Athas et al. | |
| 7,145,408 B2 | 12/2006 | Shepard et al. | |
| 7,215,188 B2 | 5/2007 | Ramaraju et al. | |
| 7,227,425 B2 | 6/2007 | Jang et al. | |
| 7,233,186 B2 | 6/2007 | Ishimi | |
| 7,301,385 B2 | 11/2007 | Takano et al. | |
| 7,307,486 B2 | 12/2007 | Pernia et al. | |
| 7,355,454 B2 | 4/2008 | Papaefthymiou et al. | |
| 7,622,977 B2 | 11/2009 | Papaefthymiou et al. | |
| 7,719,316 B2 | 5/2010 | Chueh et al. | |
| 7,719,317 B2 | 5/2010 | Chueh et al. | |
| 7,956,664 B2 | 6/2011 | Chueh et al. | |
| 7,973,565 B2 | 7/2011 | Ishii et al. | |
| 2001/0013795 A1 | 8/2001 | Nojiri | |
| 2002/0140487 A1 | 10/2002 | Fayneh et al. | |
| 2003/0189451 A1 | 10/2003 | Ziesler et al. | |
| 2005/0057286 A1 | 3/2005 | Shepard et al. | |
| 2005/0114820 A1 | 5/2005 | Restle | |
| 2006/0082387 A1 | 4/2006 | Papaefthymiou et al. | |
| 2006/0152293 A1 | 7/2006 | McCorquodale et al. | |
| 2007/0096957 A1 | 5/2007 | Papaefthymiou et al. | |
| 2007/0168786 A1 | 7/2007 | Drake et al. | |
| 2007/0216462 A1 | 9/2007 | Ishimi | |
| 2008/0136479 A1 | 6/2008 | You et al. | |
| 2008/0150605 A1 | 6/2008 | Chueh et al. | |
| 2008/0150606 A1 | 6/2008 | Kumata | |
| 2008/0164921 A1 | 7/2008 | Shin | |
| 2008/0303576 A1 | 12/2008 | Chueh et al. | |
| 2009/0027085 A1 | 1/2009 | Ishii et al. | |
| 2011/0084736 A1* | 4/2011 | Papaefthymiou et al. | 327/108 |
| 2011/0084772 A1 | 4/2011 | Papaefthymiou et al. | |
| 2011/0084773 A1 | 4/2011 | Papaefthymiou et al. | |
| 2011/0084774 A1 | 4/2011 | Papaefthymiou et al. | |
| 2011/0084775 A1 | 4/2011 | Papaefthymiou et al. | |
| 2011/0090018 A1 | 4/2011 | Papaefthymiou et al. | |
| 2011/0090019 A1* | 4/2011 | Papaefthymiou et al. | 331/117 FE |
| 2011/0109361 A1 | 5/2011 | Nishio | |
| 2011/0140753 A1 | 6/2011 | Papaefthymiou et al. | |
| 2011/0210761 A1 | 9/2011 | Ishii et al. | |
| 2011/0215854 A1 | 9/2011 | Chueh et al. | |

FOREIGN PATENT DOCUMENTS

| | | |
|---|---|---|
| EP | 1764669 | 3/2007 |
| JP | 63246865 | 10/1988 |
| JP | 7321640 | 12/1995 |
| JP | 3756285 | 1/2006 |
| WO | 2005092042 | 10/2005 |

OTHER PUBLICATIONS

Sathe, Visvesh S., et al. "Resonant-Clock Latch-Based Design," IEEE Journal of Solid-State Circuits, Apr. 2008, pp. 864-873, vol. 32, No. 4, IEEE.

Athas et al., "Low-Power Digital Systems Based on Adiabatic-Switching Principles," IEEE Transactions on Very Large Scale Integration (VLSI) Systems, vol. 2, No. 4, pp. 398-407, Dec. 1994.

Chan et al., "1.1 to 1.6GHz Distributed Differential Oscillator Global Clock Network," International Solid-State Circuits Conference, pp. 518-519, Feb. 9, 2005.

Chan et al., "A 4.6GHz Resonant Global Clock Distribution Network," IEEE International Solid-State Circuits Conference, Feb. 18, 2004.

Chan et al., "A Resonant Global Clock Distribution for the Cell Broadband Engine Processor," IEEE Journal of Solid State Circuits, vol. 44, No. 1, pp. 64-72, Jan. 2009.

Chan et al., "Design of Resonant Global Clock Distributions," Proceedings of the 21st International Conference on Computer Design, pp. 248-253, Oct. 2003.

Chueh et al., "900MHz to 1.2GHz Two-Phase Resonant Clock Network with Programmable Driver and Loading," IEEE Custom Integrated Circuits Conference, pp. 777-780, Sep. 2006.

Chueh et al., "Two-Phase Resonant Clock Distribution," Proceedings of the IEEE Computer Society Annual Symposium on VLSI: New Frontiers on VLSI Design, May 2005.

Cooke et al., "Energy Recovery Clocking Scheme and Flip-Flops for Ultra Low-Energy Application," International Symposium on Low-Power Electronic Design, pp. 54-59, Aug. 25-27, 2003.

Drake et al., "Resonant Clocking Using Distributed Parasitic Capacitance," IEEE Journal of Solid-State Circuits, vol. 39, No. 9, pp. 1520-1528, Sep. 2004.

Dunning, Jim, "An All-Digital Phase-Locked Loop with 50-Cycle Lock Time Suitable for High-Performance Microprocessors," IEEE Journal of Solid-State Circuits, vol. 30, No. 4, pp. 412-422, Apr. 1995.

Fang et al., "A High-Performance Asynchronous FPGA: Test Results," Proceedings of the 13th Annual IEEE Symposium on Field-Programmable Custom Computing Machines, Apr. 2005.

Favalli et al., "Testing Scheme for IC's Clocks," IEEE European Design and Test Conference, Mar. 1997.

Gutnik et al., "Active GHz Clock Network Using Distributed PLLs," IEEE Journal of Solid-State Circuits, vol. 35, No. 11, pp. 1553-1560, Nov. 2000.

Ishii et al., "A Resonant-Clock 200MHz ARM926EJ-S(TM) Microcontroller," European Solid-State Circuits Conference, Sep. 2009.

Kim et al., "Energy Recovering Static Memory," Proceedings of the 2002 International Symposium on Low Power Electronics and Design, pp. 92-97, Aug. 12-14, 2002.

Maksimovic et al., "Design and Experimental Verification of a CMOS Adiabatic Logic with Single-Phase Power-Clock Supply," Proceedings of the 40th Midwest Symposium on Circuits and Systems, pp. 417-420, Aug. 1997.

Maksimovic et al., "Integrated Power Clock Generators for Low Energy Logic," IEEE Annual Power Electronics Specialists Conference, vol. 1, pp. 61-67, Jun. 18-22, 1995.

Moon et al., "An Efficient Charge Recovery Logic Circuit," IEEE Journal of Solid-State Circuits, vol. 31, No. 4, pp. 514-522, Apr. 1996.

Sathe et al., "A 0.8-1.2GHz Frequency Tunable Single-Phase Resonant-Clocked FIR Filter with Level-Sensitive Latches," IEEE 2007 Custom Integrated Circuits Conference, pp. 583-586, Sep. 2007.

Sathe et al., "A 1.1GHz Charge-Recovery Logic," IEEE International Solid-State Circuits Conference, Feb. 7, 2006.

Sathe et al., "A 1GHz Filter with Distributed Resonant Clock Generator," IEEE Symposium on VLSI Circuits, pp. 44-45, Jun. 2007.

Teifel et al., "Highly Pipelined Asynchronous FPGAs," Proceedings of the 2004 ACM/SIGDA 12th International Symposium on Field Programmable Gate Arrays, pp. 133-142, Feb. 22-24, 2004.

Weste et al., "Principles of CMOS VLSI Design: A Systems Perspective," 2nd Edition, Addison-Wesley, pp. 9-11, 1992.

Ziesler et al., "A 225 MHz Resonant Clocked ASIC Chip," Proceedings of the 2003 International Symposium on Low Power Electronics and Design, pp. 48-53, Aug. 25-27, 2003.

Ziesler et al., "A Resonant Clock Generator for Single-Phase Adiabatic Systems," Proceedings of the 2001 International Symposium on Low Power Electronics and Design, pp. 159-164, Aug. 6-7, 2001.

Ziesler et al., "Energy Recovering ASIC Design," Proceedings of the IEEE Computer Society Annual Symposium on VLSI, Feb. 20-21, 2003.

Search Report and Written Opinion from International Serial No. PCT/US2007/086304 mailed Mar. 3, 2009.

Search Report and Written Opinion from International Serial No. PCT/US2008/064766 mailed Dec. 22, 2008.

Search Report and Written Opinion from International Serial No. PCT/US2010/052390 mailed Jun. 23, 2011.

Search Report and Written Opinion from International Serial No. PCT/US2010/052393 mailed Jun. 23, 2011.

Search Report and Written Opinion from International Serial No. PCT/US2010/052395 mailed Jun. 23, 2011.

Search Report and Written Opinion from International Serial No. PCT/US2010/052396 mailed Jun. 23, 2011.

Search Report and Written Opinion from International Serial No. PCT/US2010/052397 mailed Jun. 23, 2011.

Search Report and Written Opinion from International Serial No. PCT/US2010/052401 mailed Jun. 29, 2011.

Search Report and Written Opinion from International Serial No. PCT/US2010/052402 mailed Jun. 23, 2011.

Search Report from International Serial No. PCT/US2003/010320 mailed Sep. 29, 2003.

Supplementary European Search Report from European Serial No. 03716979.4 mailed Jun. 7, 2006.

Taskin, Baris et al., "Timing-Driven Physical Design for VLSI Circuits Using Resonant Rotary Clocking," 49th IEEE International Midwest Symposium on Circuits and Systems, pp. 261-265, Aug. 6, 2006.

* cited by examiner

ARCHITECTURE FOR SINGLE-STEPPING IN RESONANT CLOCK DISTRIBUTION NETWORKS

CLAIM OF PRIORITY AND RELATED APPLICATIONS

This patent application is a conversion of and claims priority to U.S. Provisional Patent Application No. 61/250,830, entitled SYSTEMS AND METHODS FOR RESONANT CLOCKING INTEGRATED CIRCUITS, filed Oct. 12, 2009, which is incorporated herein in its entirety. This patent application is related to the technologies described in the following patents and applications, all of which are incorporated herein in their entireties:

U.S. patent application Ser. No. 12/125,009, entitled RESONANT CLOCK AND INTERCONNECT ARCHITECTURE FOR DIGITAL DEVICES WITH MULTIPLE CLOCK NETWORKS, filed Oct. 12, 2009, which claims priority to U.S. Provisional Patent Application No. 60/931,582, entitled RESONANT CLOCK AND INTERCONNECT ARCHITECTURE FOR PROGRAMMABLE LOGIC DEVICES, filed May 23, 2007;

U.S. patent application Ser. No. 12/903,154, entitled RESONANT CLOCK DISTRIBUTION NETWORK ARCHITECTURE WITH PROGRAMMABLE DRIVERS, filed Oct. 12, 2010;

U.S. patent application Ser. No. 12/903,158, entitled ARCHITECTURE FOR CONTROLLING CLOCK CHARACTERISTICS, filed Oct. 12, 2010;

U.S. patent application Ser. No. 12/903,163, entitled METHOD FOR SELECTING NATURAL FREQUENCY IN RESONANT CLOCK DISTRIBUTION NETWORKS WITH NO INDUCTOR OVERHEAD, filed Oct. 12, 2010;

U.S. patent application Ser. No. 12/903,166, entitled ARCHITECTURE FOR ADJUSTING NATURAL FREQUENCY IN RESONANT CLOCK DISTRIBUTION NETWORKS, filed Oct. 12, 2010;

U.S. patent application Ser. No. 12/903,168, entitled ARCHITECTURE FOR FREQUENCY-SCALED OPERATION IN RESONANT CLOCK DISTRIBUTION NETWORKS, filed Oct. 12, 2010;

U.S. patent application Ser. No. 12/903,174, entitled ARCHITECTURE FOR OPERATING RESONANT CLOCK NETWORK IN CONVENTIONAL MODE, filed Oct. 12, 2010; and U.S. patent application Ser. No. 12/903,188, entitled RESONANT CLOCK DISTRIBUTION NETWORK ARCHITECTURE FOR TRACKING PARAMETER VARIATIONS IN CONVENTIONAL CLOCK DISTRIBUTION NETWORKS filed Oct. 12, 2010.

FIELD OF INVENTION

This disclosure relates generally to clock distribution network architectures for digital devices with multiple clock networks and various clock frequencies such as microprocessors, application-specific integrated circuits (ASICs), and System-on-a-Chip (SOC) devices.

BACKGROUND OF THE INVENTION

Resonant clock distribution networks have recently been proposed for the energy-efficient distribution of clock signals in synchronous digital systems. In these networks, energy-efficient operation is achieved using one or more inductors to resonate the parasitic capacitance of the clock distribution network. Clock distribution with extremely low jitter is achieved through reduction in the number of clock buffers. Moreover, extremely low skew is achieved among the distributed clock signals through the design of relatively symmetric all-metal distribution networks. Overall network performance depends on operating speed and total network inductance, resistance, size, and topology, with lower-resistance symmetric networks resulting in lower jitter, skew, and energy consumption when designed with adequate inductance.

In resonant clock distribution networks, the amount of energy injected into the clock network depends on certain design parameters, including the size of the final clock drivers, and the duty cycle of the reference clock signals that drive the final clock drivers. Furthermore, in contrast to conventional (that is, non-resonant) clock distribution networks, the amount of energy injected into the resonant network also depends on the frequency at which the network is operated. In general, larger driver sizes or longer duty cycles allow for more current to build up in the inductive elements, thus ultimately injecting more energy into the clock network, and resulting in faster clock rise times or larger clock amplitudes. Moreover, for fixed driver size and duty cycle, operation at a low frequency results in faster clock rise times and larger clock amplitudes than operation at a relatively higher frequency, since the final clock drivers conduct for a longer time, thus again allowing for more current to build up in the inductive elements and the injecting of more energy into the clock network.

Testing presents a challenge related with the use of resonant clock distribution networks in digital devices. Specifically, in a particular mode of testing called single-stepping, a specific bit pattern is first loaded onto specified scan registers (scan-in mode). The digital system is then operated for one clock cycle. To validate correct function, the contents of the scan registers are then read (scan-out mode). Resonant clock distribution networks typically require multiple clock cycles of operation before they are able to provide their specified clock amplitude. Moreover, they require multiple clock cycles until their clock waveforms stop oscillating. Therefore, switching from scan-in mode to a single cycle of operation is a challenge.

It is possible to address the above challenges in ways that are likely to be impractical for many designs. For example, it is possible to design resonant clock drivers so that they are capable of operating in conventional mode. These derivers typically rely on a switch that is introduced in series to the clock load, thus increasing overall resistance of the resonant clock network and degrading its energy efficiency when operating in resonant mode.

Another approach of limited practicality is to use a high-speed global enable signal to disable the clocked registers for as long as it takes for the resonant clock waveform to reach its full amplitude, and at the end of the single test clock cycle that follows the scan-in of data. Such a signal must enable all clocked registers on the same cycle after the resonant clock signal has reached full amplitude. However, the design of a network that distributes such a high-speed enable signal with acceptable skew and correct relative timing with respect to the clock requires significant additional engineering effort and physical resources (for example, signal drivers and routing tracks).

Architectures for resonant clock distribution networks have been described and empirically evaluated in the following articles: "A 225 MHz Resonant Clocked ASIC Chip," by Ziesler C., et al., *International Symposium on Low-Power Electronic Design*, August 2003; "Energy Recovery Clocking Scheme and Flip-Flops for Ultra Low-Energy Applications," by Cooke, M., et al., *International Symposium on Low-Power Electronic Design*, August 2003; and "Resonant Clocking Using Distributed Parasitic Capacitance," by Drake, A., et al., *Journal of Solid-State Circuits*, Vol. 39, No. 9, September 2004; "A 1.1 GHz Charge Recovery Logic," by Sathe V., et al., *International Solid-State Circuits Conference*, February 2006; "900 MHz to 1.2 GHz two-phase resonant clock network with programmable driver and loading," by Chueh J.-Y., et al., *IEEE 2006 Custom Integrated Circuits Conference*, September 2006; "A 0.8-1.2 GHz frequency tunable single-phase resonant-clocked FIR filter," by Sathe V., et al., *IEEE 2007 Custom Integrated Circuits Conference*, September 2007. In all these articles, resonant clock distribution networks are investigated in the context of energy efficiency. These articles do not describe any approaches to testing or, in particular, single-stepping in resonant clock networks.

A resonant clock driver that is also capable of operating in conventional mode has been described in the article "A Resonant Global Clock Distribution for the Cell Broadband Engine Processor," by Chan S., et al., *IEEE Journal of Solid State Circuits*, Vol. 44, No. 1, January 2009. The resonant clock driver in this article includes a switch in series to the clock load, thus resulting in relatively lower energy efficiency when the resonant clock network is operating in resonant mode.

Overall, the examples herein of some prior or related systems and their associated limitations are intended to be illustrative and not exclusive. Other limitations of existing or prior systems will become apparent to those of skill in the art upon reading the following Detailed Description.

SUMMARY OF THE DESCRIPTION

A resonant clock distribution network architecture is proposed that is capable of single-step operation through the use of selective control in the resonant clock drivers and the deployment of flip-flops that require the clock to remain stable for a sufficiently long time between any two consecutive state updates. Such a network is generally applicable to semiconductor devices with various clock frequencies, and high-performance and low-power clocking requirements such as microprocessors, ASICs, and SOCs.

Disclosed herein is a clock driver that can selectively be operated in a resonant mode or a non-resonant mode, the clock driver comprising: a resonance element electrically coupled to a clock node of the clock driver, the resonance element configured to enable the clock driver to operate in a resonant mode; a drive element electrically coupled to the clock node, the drive element configured to receive and propagate a reference clock of the clock distribution network based on a logical input signal, wherein the logical input signal is a logical combination of the reference clock and a control signal, wherein the drive element is enabled for operation when the control signal is in an active state; a clocking element electrically coupled to the clock node, the clocking element gated by a gating signal; wherein, the clock driver selectively operates in a resonant mode or in a non-resonant mode based on the values of the control signal and the gating signal, wherein: the clock driver operates in a resonant mode when the control signal is in an active state and the gating signal is an inactive state, wherein the clock driver operates at a frequency relative to a natural resonating frequency of the resonance element; the clock driver operates in a non-resonant mode when the control signal is in an inactive state and the gating signal is in an active state, wherein the clock driver operates at a frequency relative to a gating frequency of the gating signal This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other advantages and features will become apparent from the following description and claims. It should be understood that the description and specific examples are intended for purposes of illustration only and not intended to limit the scope of the present disclosure.

BRIEF DESCRIPTION OF DRAWINGS

These and other objects, features and characteristics of the present invention will become more apparent to those skilled in the art from a study of the following detailed description in conjunction with the appended claims and drawings, all of which form a part of this specification. In the drawings:

Figure 1:
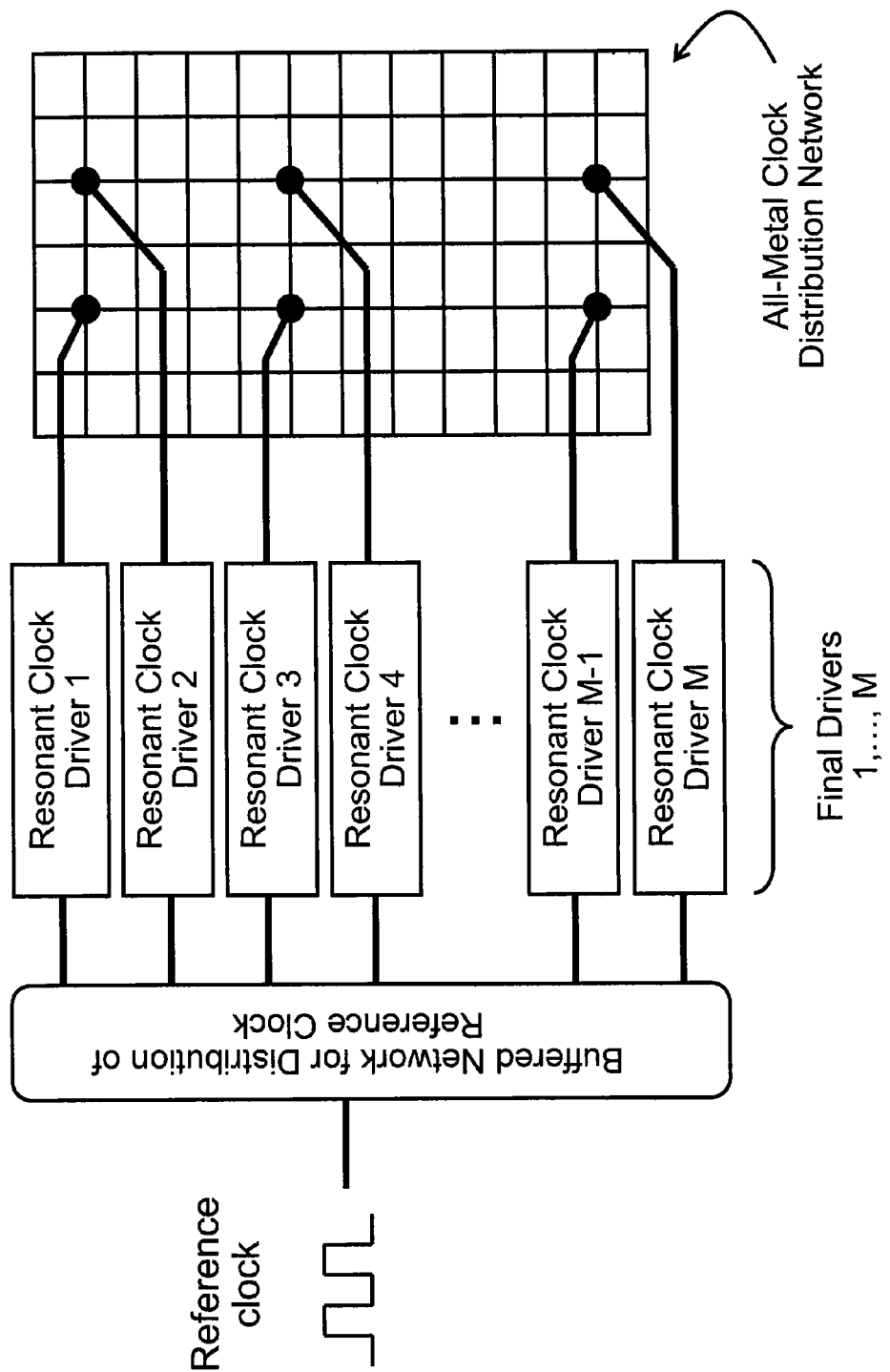
FIG. 1 shows a typical architecture of a resonant clock distribution network.

The headings provided herein are for convenience only and do not necessarily affect the scope or meaning of the claimed invention.

In the drawings, the same reference numbers and any acronyms identify elements or acts with the same or similar structure or functionality for ease of understanding and convenience.

DETAILED DESCRIPTION OF THE INVENTION

Various examples of the invention will now be described. The following description provides specific details for a thorough understanding and enabling description of these examples. One skilled in the relevant art will understand, however, that the invention may be practiced without many of these details. Likewise, one skilled in the relevant art will also understand that the invention can include many other obvious features not described in detail herein. Additionally, some well-known structures or functions may not be shown or described in detail below, so as to avoid unnecessarily obscuring the relevant description.

The terminology used below is to be interpreted in its broadest reasonable manner, even though it is being used in conjunction with a detailed description of certain specific examples of the invention. Indeed, certain terms may even be emphasized below; however, any terminology intended to be interpreted in any restricted manner will be overtly and specifically defined as such in this Detailed Description section.

FIG. 1 shows a typical resonant clock distribution network architecture for a semiconductor device. In this network, a buffered distribution network is used to distribute a reference clock signal to multiple resonant clock drivers that are in turn used to drive the clock signal across an all-metal clock distribution network. Typically, this all-metal network has an approximately symmetric topology, delivering the clock signal to the clocked elements (for example, flip-flops and clock gaters) of the semiconductor device with very low skew. Each resonant clock driver incorporates an inductor that is used to provide additional drive strength with low energy consumption by resonating the parasitic capacitance of the load seen by the driver.

Figure 2:
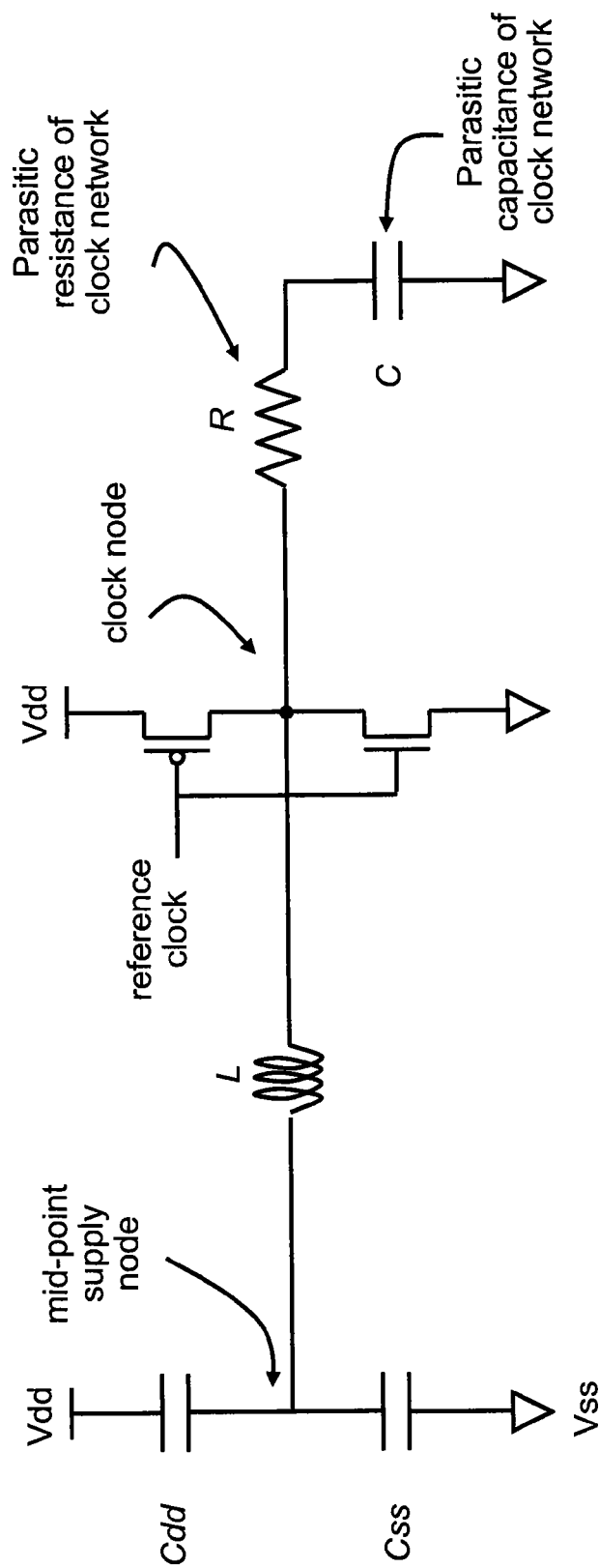
FIG. 2 shows a typical driver design for resonant clocking with the clock load modeled as a lumped capacitor.

FIG. 2 shows a typical resonant clock driver design, in which the part of the overall clock distribution network serviced by the resonant clock driver is modeled as a lumped capacitor C in series with a lumped resistance R. This driver comprises a pull-up PMOS and a pull-down NMOS device for driving the clock. The PMOS device is connected between the clock node and the power supply terminal. The NMOS device is connected between the clock node and the ground terminal. Both devices are driven by the reference clock signal. An inductor L is connected between the clock node and a supply node with voltage at approximately the mid-point of the clock signal oscillation. For example, if the clock signal oscillates between 0V and 1V, the mid-point supply voltage is approximately 0.5V. In the driver of this figure, the mid-point is implemented using two capacitors Cdd and Css. Capacitor Cdd is connected between the mid-point and the power supply terminal. Capacitor Css is connected between the mid-point and the ground terminal. To maximize energy savings, the value of the inductor is approximately chosen so that the LC tank set-up by the inductor and the parasitic capacitance of the clock distribution network has a natural frequency that is approximately equal to the frequency of the reference clock signal.

The energy efficiency of the resonant clock driver depends on various design and operating parameters. The quality factor Q of the resonant system is an indicator of its energy efficiency. This factor is proportional to $(L/C)^{1/2}/R$. In general, energy efficiency decreases as R increases, due to the $I^2R$ losses associated with the flow of the current I that charges and discharges the parasitic clock load C through the resistance R. Also, for a fixed natural frequency, energy efficiency decreases as capacitance C increases, since the current flowing through resistance R increases.

The mismatch between the natural frequency of the resonant LC-tank system and the frequency of the reference clock signal is another important factor that affects the energy efficiency of the resonant clock network. As the frequency of the reference clock that drives the resonant clock driver moves further away from the natural frequency of the resonant clock driver's LC-tank, energy efficiency decreases. When the mismatch between the two frequencies becomes too large, the energy consumption of the resonant clock driver becomes excessive and impractically high. Moreover, the shape of the clock waveform is so distorted that it cannot be reliably used to clock flip-flops or other clocked storage elements. Consequently, resonant clock drivers tend to have a narrower range of clock frequencies within which they operate efficiently than the range of clock frequencies typically supported by a semiconductor device that uses frequency scaling. In practice, to support the broad range of operating frequencies used in a frequency-scaled semiconductor device, it is desirable for the resonant clock network to be capable of operating at more than one frequency.

Figure 3:
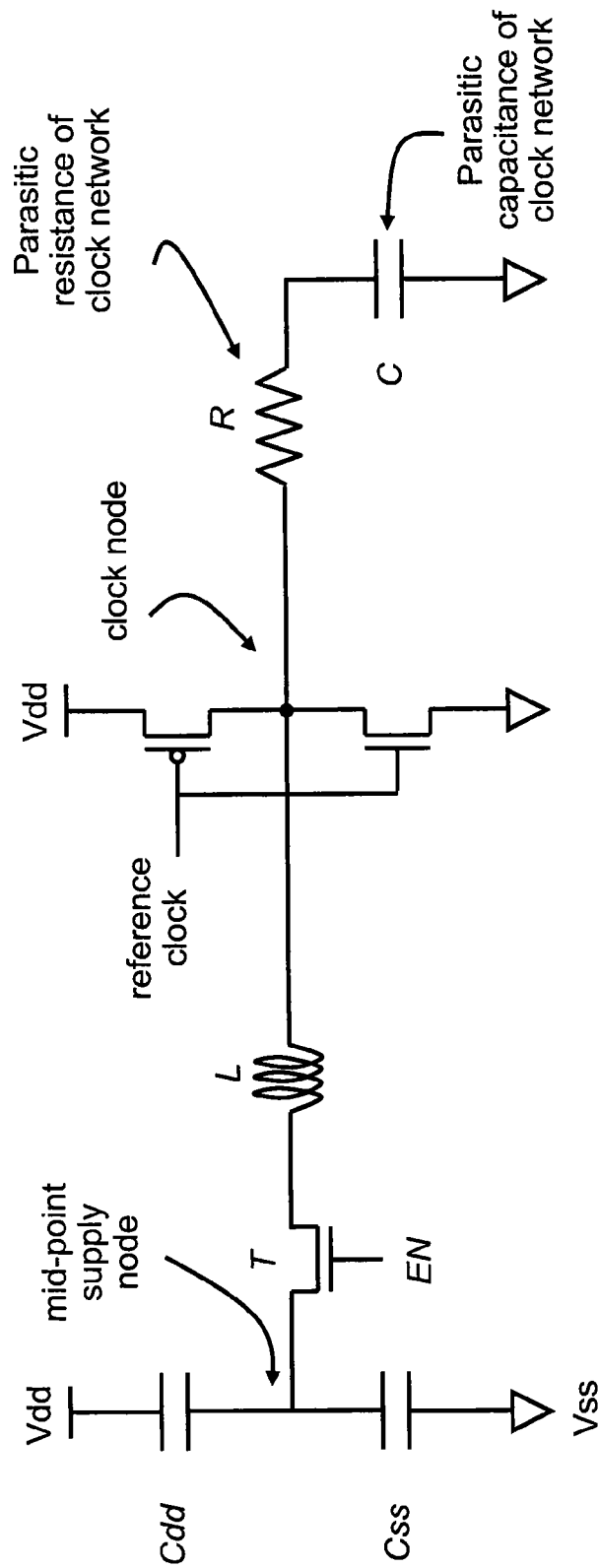
FIG. 3 shows an approach for supporting single-step operation by introducing a switch in series to the inductive element of the resonant clock network.

FIG. 3 shows a possible approach for supporting single-step operation. In this approach, a switch T is introduced in series to the inductive element of the resonant clock network. Switch T can be used to selectively decouple the inductor from the mid-point supply, thus providing the option of driving the clock network in conventional (i.e., non-resonant) mode. When the control signal EN turns the switch on, the driver operates in resonant mode. When the switch is off, then the driver operates in conventional mode at the frequency of the reference clock. In this mode, the capacitance of the clock network is not resonated and, therefore, the clock network can operate at the frequency of the reference clock without any concern about the mismatch of this frequency from the natural frequency of the LC tank. In this figure, the switch is shown conceptually as a single NMOS transistor. In general, this switch will be typically implemented as a transmission gate that incorporates both NMOS and PMOS transistors.

The main advantage of the approach shown in FIG. 3 is that it allows for the operation of the clock network at any arbitrary frequency, as dictated by the frequency of the reference clock signal. However, the drawback of this approach is that switch T is in series to the inductive element of the resonant clock network, adding to its total resistance and, thus, significantly degrading the efficiency of the clock network when operating in resonant mode.

The proposed architecture relies on two key elements for supporting single-step operation while avoiding the introduction of a switch in series with the clock load. The first key element of the proposed architecture is the selective control of the pull-down and pull-up devices in the resonant clock driver. Specifically, by activating only the pull-down (or the pull-up) devices in the resonant clock driver, the clock node is clamped to the ground (or the supply voltage Vdd) and current builds up in the inductor. Upon release of the pull-down (or the pull-up) device, the energy in the magnetic field of the inductor is rapidly converted into electric energy that is stored in the capacitor of the clock node, driving the voltage of the clock node to a high (or low) value. This initial conversion from magnetic to electric energy provides the clocking edge required for the single step. Subsequently, the clock performs a free-running oscillation that decays gradually due to the resistance of the clock network.

The second key element of the proposed architecture is a flip-flop design that cannot update its state unless the clock signal has remained low (or high) for a sufficiently long time between two consecutive rising (or falling) clock edges. With such a flip-flop, when the resonant clock performs its free-running damped oscillation, it does not provide the flip-flop with sufficient time to prepare for a state update on the next clocking edge.

Figure 4:
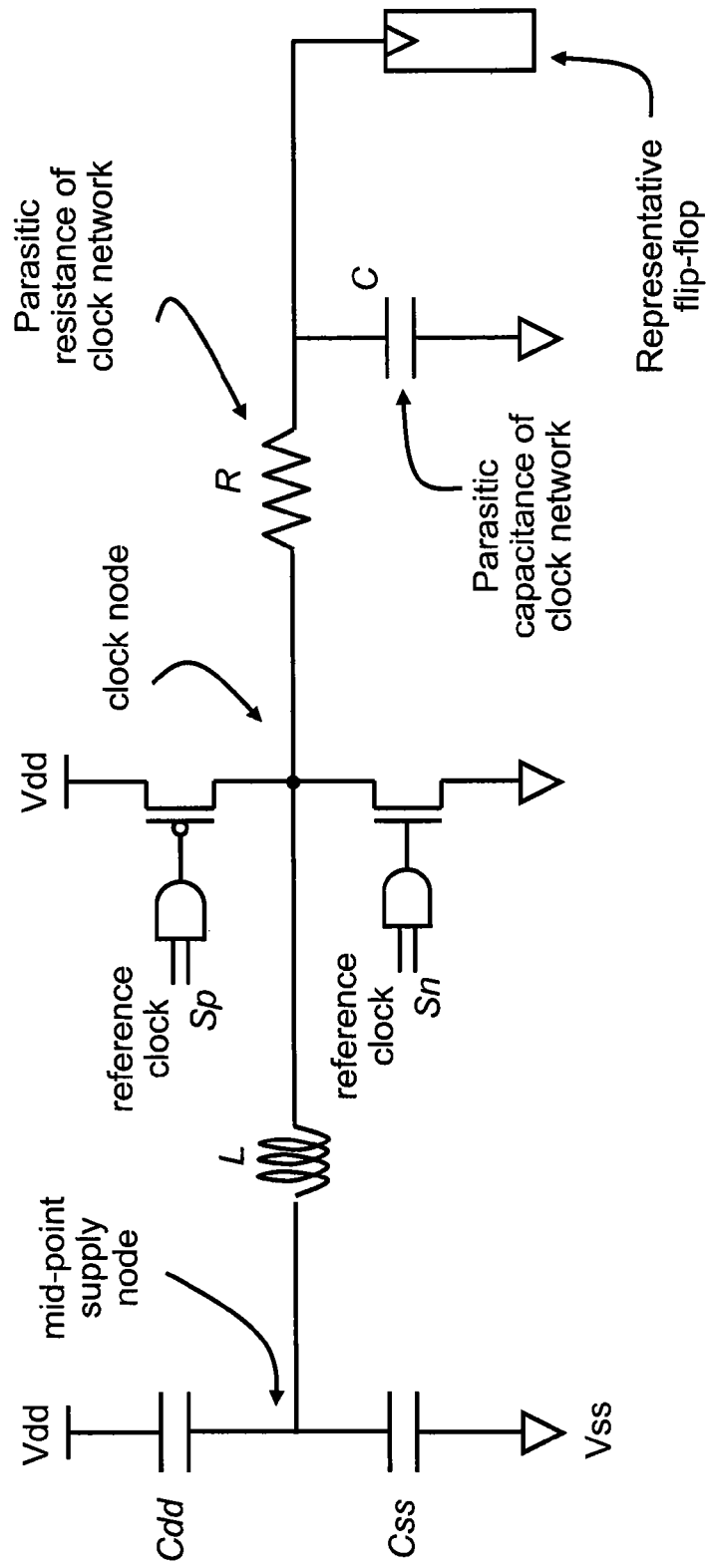
FIG. 4 shows an embodiment of the proposed resonant clock driver for single-step operation.

An embodiment of the proposed resonant clock driver for operating a resonant clock network in single-step mode is shown in FIG. 4. In this embodiment, a control signal Sp is introduced in the basic resonant clock driver design of FIG. 2 to selectively pull the clock node to the supply voltage, independently of the reference clock signal. This function is accomplished by combining the control signal Sp and the reference clock signal through an AND gate whose output drives the PMOS device of the resonant clock driver.

The embodiment of the resonant clock driver shown in FIG. 4 also includes a control signal Sn that is introduced in the basic resonant clock driver design of FIG. 2 to selectively pull the clock node to ground. This function is accomplished by combining the control signal Sn and the reference clock signal through an AND gate whose output drives the NMOS device of the resonant clock driver.

Figure 5:
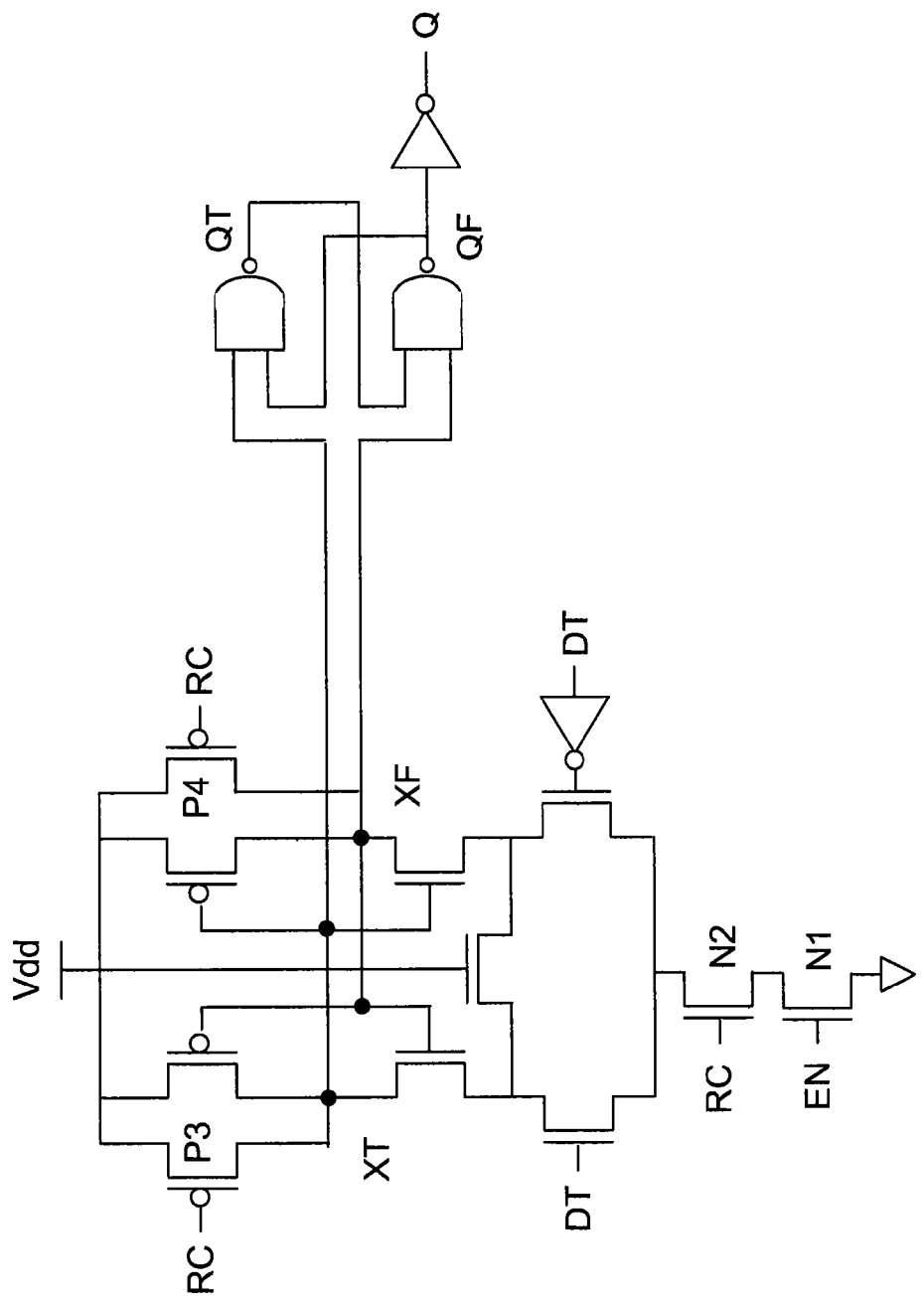
FIG. 5 shows an embodiment of the proposed flip-flop for the resonant clock driver for single-step operation.

An embodiment of the proposed flip-flop for supporting operation in single-step mode is shown in FIG. 5. This flip-flop is based on a set-reset topology. The state of this flip-flop is stored in the cross-coupled pair of NAND gates. Specifically, while the clock signal RC is low, the internal nodes XT and XF are charged to the level of the supply voltage Vdd through the PMOS devices P3 and P4. When both XT and XF are at a high voltage level, the value stored by the pair of cross-coupled NAND gates is not affected, since for NAND gates, high input values are non-controlling. On the rising edge of the clock signal RC, one of the internal nodes XT and XF is driven to a low voltage, depending on the data input value DT. (When DT is high/low, then XT is set low/high and XF high/low.) This pair of opposite values on nodes XT and XF results in a pair of opposite values at the outputs QT and QF. (When DT is high/low, then QT is set high/low and XF low/high.) This pair of output values is stored in a stable manner by the pair of NAND gates, due to their cross-coupled topology.

The proposed resonant clock driver in FIG. 4 operates in conjunction with the proposed flip-flop in FIG. 5 to achieve single-step operation. The main idea is that if the clock signal RC does not remain at a low voltage for a sufficiently long time, then the internal nodes XT and XF are not charged back to a high voltage, and the flip-flop does not update its state on subsequent rising edges of the clock signal RC. For the duration of the single-step operation mode, the reference clock is held at a high voltage level. Initially, Sp and Sn are at a low voltage, driving the clock node to a high voltage. Subsequently, signal Sp is driven high, letting the clock node float at a high voltage. Next, signal Sn is driven high, building up current in the inductor and pulling the clock node low. While the clock node is kept at a low voltage, both of the internal nodes XT and XF charge up to the supply voltage Vdd. Subsequently, signal Sn is driven back to a low voltage. At that time, the clock node is released and performs a free-running damped oscillation, until it either settles at some intermediate value, or is clamped to Vdd by driving Sp low. The oscillation of the clock node is not replenished by any driver, and the clock waveform does not reach a sufficiently low voltage for sufficiently long to enable internal nodes XT and XF to charge back to the supply voltage Vdd. Therefore, the flip-flops update their state only once, namely on the rising edge of the clock right after signal Sn is driven back to low. After the clock node completes the rising transition immediately after signal Sn is driven back to low, the signal Sp can be driven low, clamping the clock node to the level of the supply voltage Vdd, though in the general case, signal Sp only need be driven low for some interval sufficient to keep the voltage on the mid-point supply node from slowly drifting to a voltage that is too low to support the single oscillation cycle required for the flip-flops to update their state. The described mode of operation for single-step operation can also be used to realize operation at an arbitrary clock frequency, and can easily be modified to accommodate devices where flip-flops that store values on the falling edges of the clock are desired.

Figure 6:
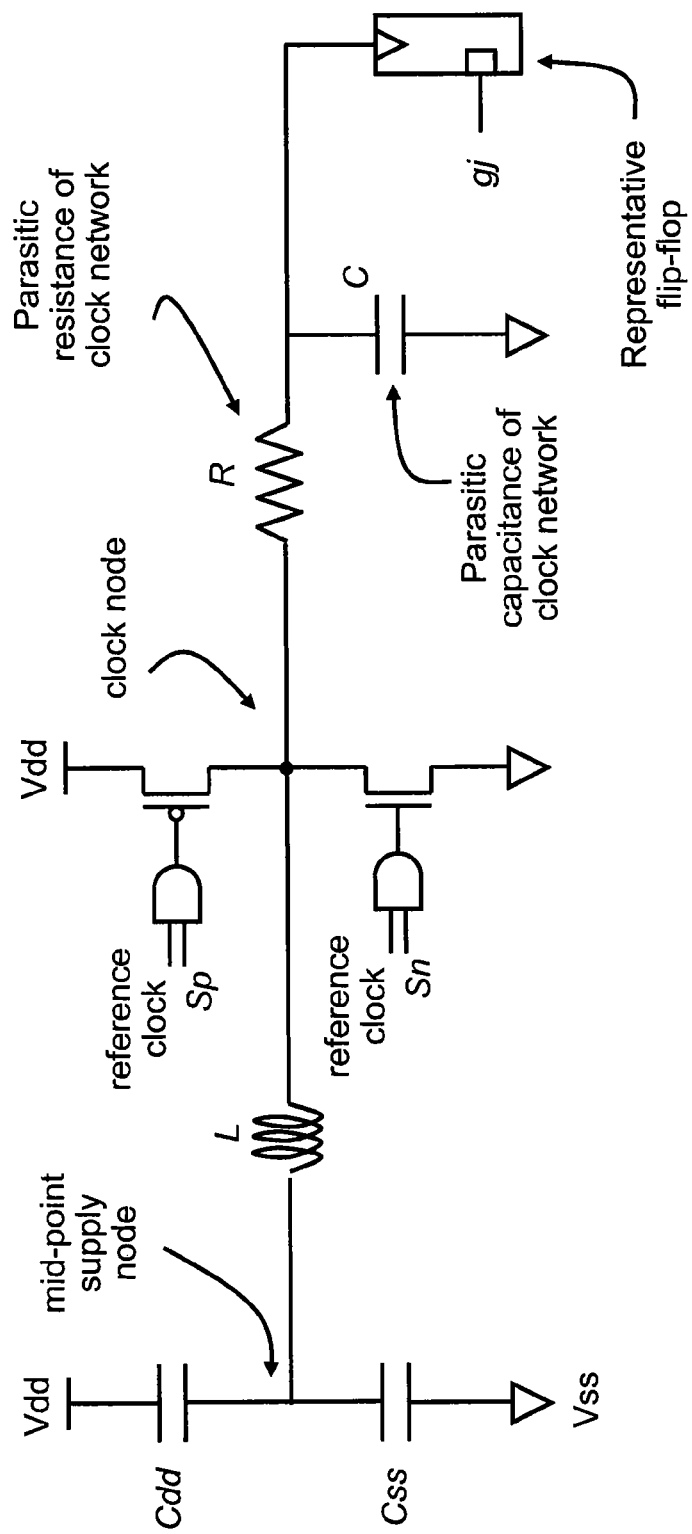
FIG. 6 shows an alternative embodiment of the proposed resonant clock driver for single-step operation.

FIG. 6 shows an alternative embodiment of the proposed resonant clock driver which is used in conjunction with flip-flops that can be selectively disabled by a gating signal g. One such representative flip-flop, which can be gated by signal gj, is shown in FIG. 6. In this embodiment, the gating signal can be used to prevent the flip-flops from updating their state while the reference clock is transitioning to a high voltage value after the completion of the scan-in phase, or while the data are scanned out.

Figure 7:
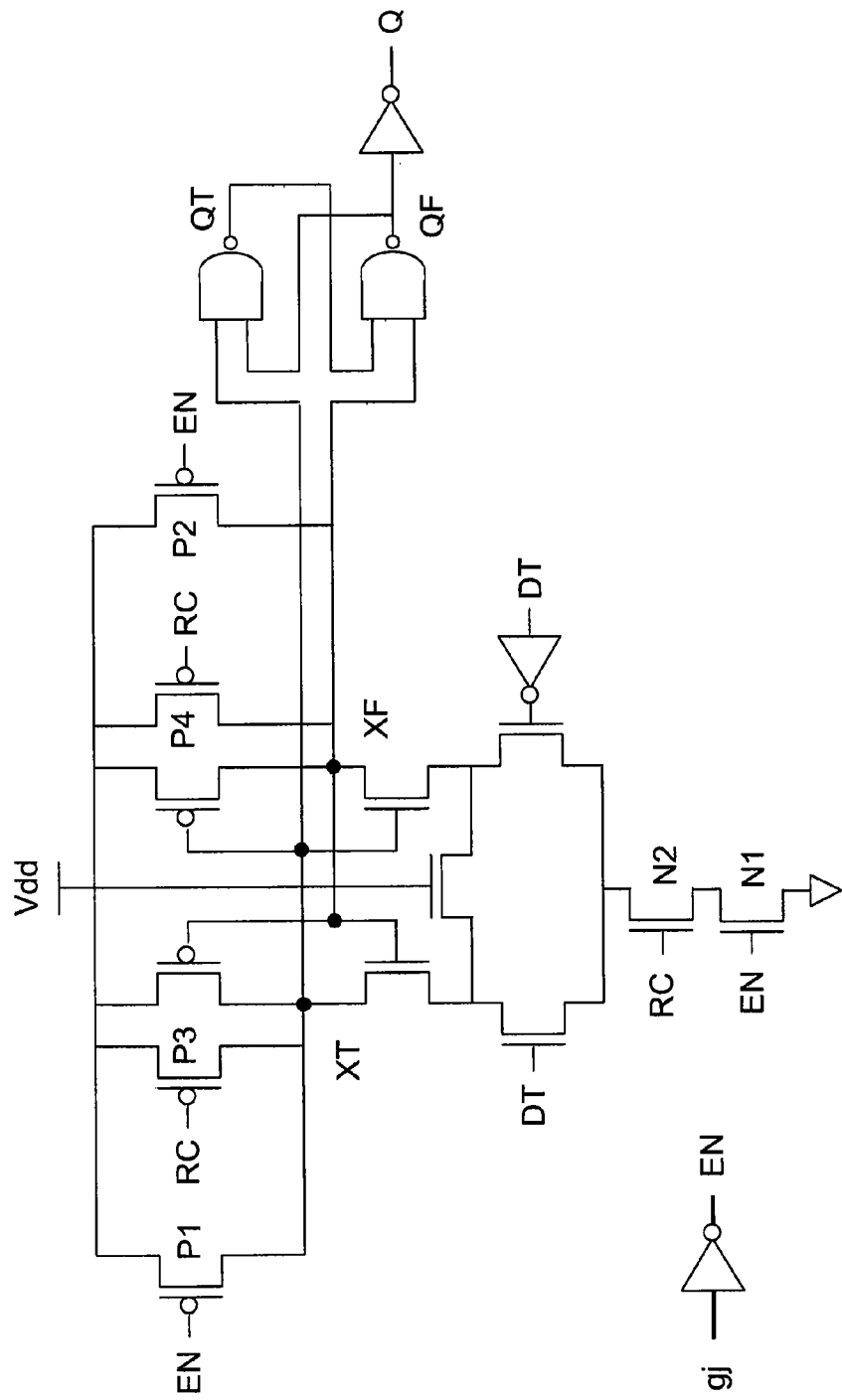
FIG. 7 shows an alternative embodiment of the proposed flip-flop for single-step operation, which includes a gating signal.

FIG. 7 shows an embodiment of the proposed flip-flop with a gating signal. In this embodiment, the topology of the flip-flop shown in FIG. 5 has been augmented to include a gating signal gj. When the gating signal is activated (i.e., gj is high), signal EN is low, and the footer device N1 does not conduct any current, thus preventing the flip-flop from updating its state. Moreover, the internal nodes XT and XF are held at the level of the supply voltage Vdd, thus preventing any change in the state of the flip-flop due to leakage in the charge of these nodes. When the gating signal is de-activated (i.e., gj is low), the footer device N1 conducts, and the flip-flop updates its state on every rising edge of the clock signal RC by selectively pulling one of the internal nodes XT and XF to the ground, depending on the value of the data input DT.

Figure 8:
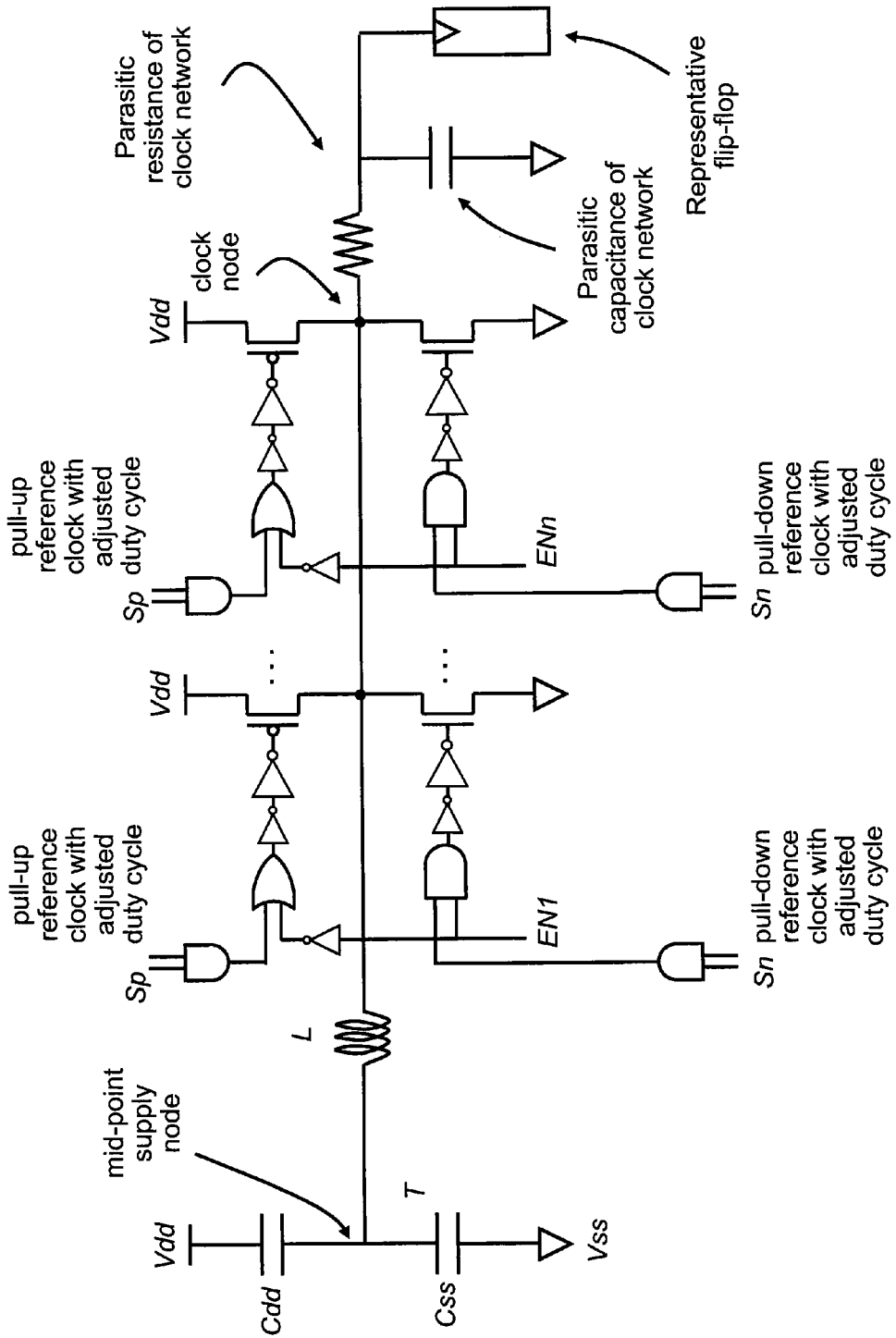
FIG. 8 shows an alternative embodiment of the proposed resonant clock driver for single-step operation.

FIG. 8 shows an alternative embodiment of the proposed resonant clock driver. In this embodiment, the NMOS and PMOS devices of the driver can be selectively enabled using control signals EN1, . . . , ENn. In this embodiment, the NMOS devices can be driven by a reference clock that has a different duty cycle from the reference clock that drives the PMOS devices. Moreover, the strength of the pull-up and pull-down can be adjusted depending on the target rise/fall times and amplitude of the clock waveform.

Figure 9:
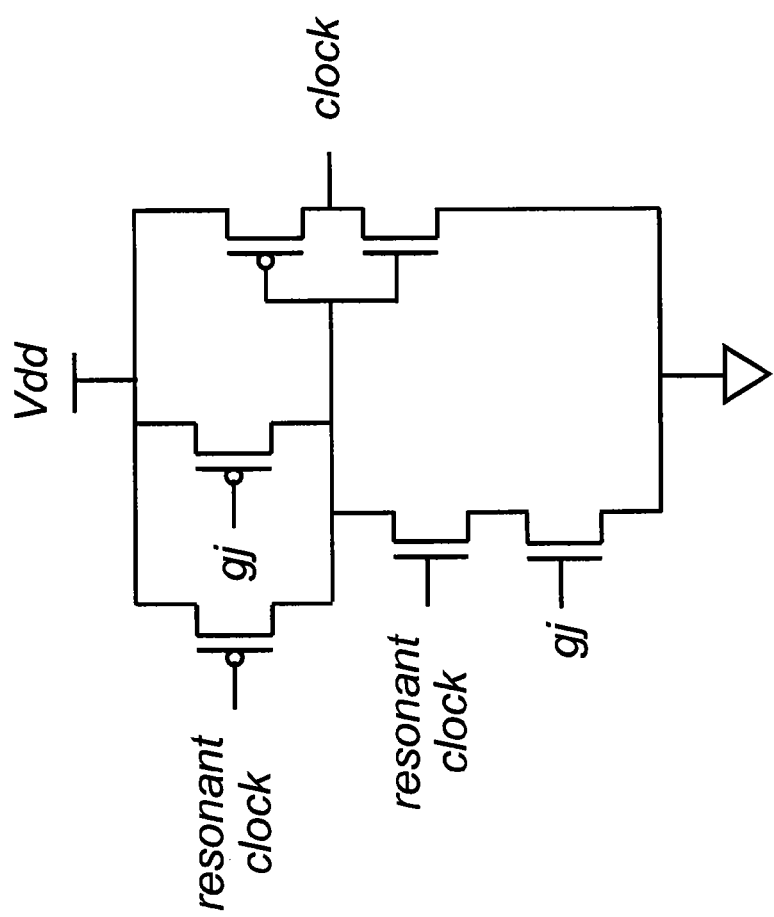
FIG. 9 shows an embodiment of a proposed glock gater that can be used in conjunction with the proposed resonant clock driver for single-step operation.

FIG. 9 shows an embodiment of a proposed clock gater that can be used in conjunction with the proposed resonant clock driver. In this embodiment, if the gating signal gj is active (i.e., at a low voltage level), then the resonant clock signal is prevented from propagating to the output of the clock gater device, in which case the output port clock also presents a low voltage, regardless of the level of the resonant clock signal. If the gating signal gi is inactive (i.e., at a high voltage level), then the resonant clock propagates to the output of the clock gater, driving the port clock low/high whenever it makes a falling/rising transition. While the resonant clock is at a low voltage level, the output of the clock gater remains low, regardless of the level of the clock gater signal gj. While the resonant clock is at a high voltage level, however, then the output port clock is driven low/high whenever the gating signal gj makes a falling/rising transition. Therefore, when the resonant clock signal is high, the clock gating signal gj can be used as an alternative clock signal.

Unless the context clearly requires otherwise, throughout the description and the claims, the words "comprise," "comprising," and the like are to be construed in an inclusive sense (i.e., to say, in the sense of "including, but not limited to"), as opposed to an exclusive or exhaustive sense. As used herein, the terms "connected," "coupled," or any variant thereof means any connection or coupling, either direct or indirect, between two or more elements. Such a coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the invention is not intended to be exhaustive or to limit the invention to the precise form disclosed above. While specific examples for the invention are described above for illustrative purposes, various equivalent modifications are possible within the scope of the invention, as those skilled in the relevant art will recognize. While processes or blocks are presented in a given order in this application, alternative implementations may perform routines having steps performed in a different order, or employ systems having blocks in a different order. Some processes or blocks may be deleted, moved, added, subdivided, combined, and/or modified to provide alternative or sub-combinations. Also, while processes or blocks are at times shown as being performed in series, these processes or blocks may instead be performed or implemented in parallel, or may be performed at different times. Further any specific numbers noted herein are only examples. It is understood that alternative implementations may employ differing values or ranges.

The various illustrations and teachings provided herein can also be applied to systems other than the system described above. The elements and acts of the various examples described above can be combined to provide further implementations of the invention.

Any patents and applications and other references noted above, including any that may be listed in accompanying filing papers, are incorporated herein by reference. Aspects of the invention can be modified, if necessary, to employ the systems, functions, and concepts included in such references to provide further implementations of the invention.

These and other changes can be made to the invention in light of the above Detailed Description. While the above description describes certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

While certain aspects of the invention are presented below in certain claim forms, the applicant contemplates the various aspects of the invention in any number of claim forms. For example, while only one aspect of the invention is recited as a means-plus-function claim under 35 U.S.C. §112, sixth paragraph, other aspects may likewise be embodied as a means-plus-function claim, or in other forms, such as being embodied in a computer-readable medium. (Any claims intended to be treated under 35 U.S.C. §112, ¶6 will begin with the words "means for.") Accordingly, the applicant reserves the right to add additional claims after filing the application to pursue such additional claim forms for other aspects of the invention.

We claim:

1. A clock distribution network that can selectively be operated in a resonant mode or a non-resonant mode, the clock distribution network comprising:
   a resonance element electrically coupled to a clock node of the clock distribution network, the resonance element configured to enable the clock distribution network to operate in a resonant mode;
   a drive element electrically coupled to the clock node, the drive element configured to receive and propagate a reference clock signal of the clock distribution network based on at least one of control signals and the reference clock signal, wherein the drive element propagates the reference clock signal when at least one of the control signal is in an active state; and
   a clocking element electrically coupled to the clock node, the clocking element gated by a gating signal;
   wherein, the clock distribution network selectively operates in a resonant mode or in a non-resonant mode based on the values of the at least one control signal and the gating signal, wherein:
      the clock distribution network operates in a resonant mode when one or more control signal states of the one or more control signals are at an active state and a gating signal state of the gating signal is at a first state; and
      the clock distribution network operates in a non-resonant mode when the one or more control signal states of the one or more control signals are at an inactive state and the gating signal state of the gating signal is at an alternate state.

2. The clock distribution network of claim 1, wherein the clocking element includes a data storage device.

3. The clock distribution network of claim 2, wherein a data storage device state of the data storage device updates in response to a transition of the gating signal state of the gating signal from the first state to the alternate state when the control signal state of the control signal is at the inactive state.

4. The clock distribution network of claim 2, wherein when the clock node is in a predetermined state, the data storage device state of the data storage device transitions in response to a transition of the gating signal state.

5. The clock distribution network of claim 1, wherein the clocking element includes a clock gater device.

6. The clock distribution network of claim 5, wherein the clock gater device is configured to propagate state information of the clock node to an output of the gater device when the gating signal state of the gating signal is at the first state, and the clock gater device is configured to propagate the gating signal state of the gating signal to the output when the state information of the clock node corresponds to the inactive state of the control signal.

7. The clock distribution network of claim 1, wherein the drive element includes a plurality of pull-up and pull-down devices, each of the plurality of devices being configured to be selectively activated by a corresponding control signal of the one or more control signals.

8. The clock distribution network of claim 7, wherein one or more of the plurality of pull-up devices propagates a pull-up reference clock with adjusted duty cycle or one or more of the plurality of pull-down devices propagates a pull-down reference clock with adjusted duty cycle.

9. A method of operation of a clock distribution network, the method comprising:
   electrically coupling a resonance element to a clock node of the clock distribution network, the resonance element configured to enable the clock distribution network to operate in a resonant mode;
   electrically coupling a drive element to the clock node, the drive element configured to receive and propagate a reference clock signal of the clock distribution network based on at least one of control signals and the reference clock signal, wherein the drive element propagates the reference clock signal when at least one of the control signals is in an active state;
   electrically coupling a clocking element to the clock node, the clocking element gated by a gating signal;
   selectively operating the clock distribution network in a resonant mode or in a non-resonant mode based on one or more control signal states of the one or more control signals and a gating signal state of the gating signal, wherein:
      the clock distribution network operates in a resonant mode when the one or more control signal states of the one or more control signals are at an active state and the gating signal state of the gating signal is at a first state; and the clock distribution network operates in a non-resonant mode when the one or more control signal states of the one or more control signals are at an inactive state and the gating signal state of the gating signal is at an alternate state.

10. The method of claim 9, further comprising:

selecting to operate the clock distribution network in the non-resonant mode when it is desired to operate the clock distribution network at a frequency that does not approximate the natural resonating frequency of the resonance element.

11. The method of claim 9, further comprising:

electrically coupling a plurality of pull-up and pull down devices to the clock node, each of the plurality of pull-up and pull-down devices being further configured to receive and propagate a reference clock of the clock distribution network based on a corresponding control signal of the one or more control signals, wherein each of the pull-up and pull-down devices propagates the reference clock when a corresponding control signal state of the corresponding control signal is at an active state; and adjusting the corresponding control signals to change a quantity of pull-up and pull-down devices of the plurality of pull-up and pull-down devices that propagate the reference clock signal.

12. The method of claim 9, further comprising:

changing the resonant mode of the clock distribution network to the non-resonant mode by activating the gating signal before deactivating the one or more control signals, and maintaining the gating signal state of the gating signal at a first state until a clock node state of the clock node has stabilized corresponding to the inactive state of the control signal.

13. The method of claim 9, wherein the clocking element includes a data storage device.

14. The method of claim 9, wherein the clocking element includes a clock gater device.

15. The method of claim 11, wherein one or more of the plurality of pull-up devices propagates a pull-up reference clock with adjusted duty cycle or one or more of the plurality of pull-down devices propagates a pull-down reference clock with adjusted duty cycle.

* * * * *